(12) United States Patent
Ikeda et al.

(10) Patent No.: US 8,363,924 B2
(45) Date of Patent: Jan. 29, 2013

(54) ELECTRONIC DEVICE TESTING APPARATUS

(75) Inventors: Katsuhiko Ikeda, Tokyo (JP); Masayoshi Ichikawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 1255 days.

(21) Appl. No.: 11/996,000

(22) PCT Filed: Aug. 11, 2005

(86) PCT No.: PCT/JP2005/014775
§ 371 (c)(1),
(2), (4) Date: Jan. 17, 2008

(87) PCT Pub. No.: WO2007/017953
PCT Pub. Date: Feb. 15, 2007

(65) Prior Publication Data
US 2009/0127068 A1    May 21, 2009

(51) Int. Cl.
*G01R 1/04* (2006.01)
*B23Q 17/00* (2006.01)

(52) U.S. Cl. ........ 382/151; 382/141; 324/537; 324/555; 324/759.01

(58) Field of Classification Search ............ 382/14–152; 348/87, 94, 95, 129, 133; 324/756.01–757.04, 324/759.01–759.02
See application file for complete search history.

(56) References Cited

U.S. PATENT DOCUMENTS

| | | | |
|---|---|---|---|
| 5,619,328 A * | 4/1997 | Sakurai | 356/621 |
| 5,739,846 A * | 4/1998 | Gieskes | 348/87 |
| 6,168,002 B1 | 1/2001 | Takahashi et al. | |
| 6,259,247 B1 * | 7/2001 | Bannai | 324/750.03 |
| 6,583,634 B1 | 6/2003 | Nozoe et al. | |
| 7,813,559 B2 * | 10/2010 | Duquette et al. | 382/219 |
| 2002/0070362 A1 * | 6/2002 | Duquette | 250/559.3 |
| 2002/0079468 A1 | 6/2002 | Takeuchi et al. | |
| 2003/0027363 A1 * | 2/2003 | Kodama | 438/14 |
| 2003/0110610 A1 * | 6/2003 | Duquette et al. | 29/407.09 |

FOREIGN PATENT DOCUMENTS

| | | |
|---|---|---|
| JP | 9-074128 | 3/1997 |
| JP | 10-087070 | 4/1998 |
| JP | 2000-314710 | 11/2000 |
| JP | 2002-196040 | 7/2002 |

OTHER PUBLICATIONS

English language Abstract of JP 2002-196040, Oct. 2002.
English language Abstract of JP 2000-314710, Nov. 2000.
English language Abstract of JP 10-087070, Jul. 1998.
English language Abstract of JP 9-074128, Mar. 1997.

* cited by examiner

*Primary Examiner* — Kara E. Geisel
*Assistant Examiner* — Rebecca C Bryant
(74) *Attorney, Agent, or Firm* — Greenblum & Bernstein P.L.C.

(57) ABSTRACT

An electronic device testing apparatus for conveying electronic devices to be tested to sockets of a contact portion and bringing the electronic devices to be tested electrically contact with the sockets to conduct a test of electric characteristics of the electronic devices to be tested, comprising an image pickup portion that takes an image of the sockets; a memory portion that stores reference image data of the sockets in a state of not being attached with any electronic devices to be tested obtained by taking images by the image pickup portion; and a mislay determination portion that obtains check image data of the sockets from the image pickup portion, reads the reference image data from the memory portion, compares the check image data with the reference image data and determines whether any of the electronic devices to be tested remain on the sockets.

17 Claims, 5 Drawing Sheets

ELECTRONIC DEVICE TESTING APPARATUS

TECHNICAL FIELD

The present invention relates to an electronic device testing apparatus capable of detecting whether any of electronic devices to be tested (hereinafter, also simply referred to as an IC device) remain on sockets.

BACKGROUND ART

In a production procedure of electronic devices, such as IC devices, an electronic device testing apparatus is used for testing performance and functions of the produced electronic devices.

An electronic device testing apparatus as an example of the related art is provided with a test section for conducting a test on IC devices, a loader section for sending pre-test IC devices to the test section and an unloader section for taking out post-test IC devices from the test section and classifying them. The loader section is provided with a buffer stage capable of moving back and forth between the loader section and the test section, and a loader section conveyor device provided with a suction portion for picking up by suction and holding IC devices and capable of moving in a range from a customer tray to a heat plate and from the heat plate to the buffer stage. Also, the test section is provided with a contact arm capable of picking up and holding IC devices by suction and pressing them against sockets of a test head and a test section conveyor device capable of moving in a range of the test section.

In the loader section conveyor device, IC devices carried on the customer tray are picked up and held by the suction portion and loaded on the heat plate and, then, the IC devices heated to be a predetermined temperature on the heat plate are again picked up and held by the suction portion and loaded on the buffer stage. Then, the buffer stage loaded with the IC devices moves from the loader section to the test section side. Next, the test section conveyor device uses the contact arm to pick up and hold the IC devices on the buffer stage and press them against sockets of the test head, so that external terminals (device terminals) of the IC devices are brought to contact with connection terminals (socket terminals) of the sockets.

In that state, by applying to the IC devices test signals supplied to the test head from the tester body through a cable and sending response signals read from the IC devices to the tester body through the test head and cable, electric characteristics of the IC devices are measured.

However, in the series of operations of the test section conveyor device explained above, even when the operation of pressing the IC devices against the sockets fails or the operation of picking up by suction the IC devices on the sockets fails, the next operation is successively performed while IC devices are left on the sockets. If next IC devices are pressed against the sockets for conducting a test, the next IC devices cannot be pressed against the sockets because the previous IC devices remain and the test cannot be conducted normally.

Such a disadvantage as "double placing of IC devices" results in erroneous recognition of a test result of the previous IC device as that of the next IC device and erroneous classification of IC devices, in addition to a disadvantage that the test on IC devices cannot be conducted normally. Also, the sockets and IC devices may be damaged as a result that the IC devices are piled when being pressed.

In the related art, as a countermeasure of such disadvantages, an alarm is set off to draw operator's attention in the case of occurring an erroneous suction, etc. of an IC device and the operator removes the IC device. However, the disadvantages of "double placing of IC devices" cannot be eliminated completely by checking with human eyes.

Note that there is the case of performing a maintenance operation of the electronic device testing apparatus with IC devices placed on the sockets, and again, the same disadvantages arise when removal of the IC devices used in the maintenance operation is forgotten after the operation.

DISCLOSURE OF INVENTION

An object of the present invention is to provide an electronic device testing apparatus capable of detecting whether any of electronic devices to be tested remain on the sockets.

To attain the above object, according to the present invention, there is provided an electronic device testing apparatus for conveying electronic devices to be tested to sockets of a contact portion and bringing the electronic devices to be tested electrically contact with the sockets to conduct a test of electric characteristics of the electronic devices to be tested, comprising: an image pickup portion that takes an image of the sockets; a memory portion that stores reference image data of the sockets in a state of being not attached with the electronic devices to be tested obtained by taking an image by the image pickup portion; and a mislay determination portion that obtains check image data of the sockets from the image pickup portion, reads the reference image data from the memory portion, compares the check image data with the reference image data and determines whether any of the electronic devices to be tested remain on the sockets.

In the present invention, whether any of electronic devices to be tested remain on the sockets or not is determined by comparing image data of actual sockets taken by image pickup portions (check image data) with image data of the sockets without electronic devices to be tested taken in advance and stored in the memory portion (reference image data). Consequently, whether any of electronic devices to be tested remain on the sockets or not can be automatically determined without checking sockets with eyes by the operator. Particularly, since an existence of an electronic device to be tested can be easily detected from image data, time for determination processing is short and erroneous determination is not caused.

Preferably, the electronic device testing apparatus according to the present invention comprises an alarm portion that promotes awareness of remaining electronic devices when the mislay determination portion determines that any of the electronic devices to be tested remain on the sockets.

According to this invention, it is possible to surely draw operator's attention when an electronic device to be tested remain on the sockets, therefore, it is possible to prevent incorrect tests and damages on the sockets and electronic devices to be tested in advance.

Preferably, the electronic device testing apparatus according to the present invention comprises a conveyor portion that holds the electronic devices to be tested and presses the same against the sockets, and the image pickup portions are attached to the conveyor portion.

As a result of providing the image pickup portions to the conveyor portion, it becomes unnecessary to separately provide a device for conveying the image pickup devices to the socket positions.

In the electronic device testing apparatus according to the present invention, timing of making determination whether any of the electronic devices to be tested remain on the sockets is not particularly limited.

For example, in the case where abnormality arises in the operation of pressing electronic devices to be tested against the sockets or in the case where abnormality arises in the operation of picking up by suction IC devices on the sockets, the possibilities are high that electronic devices to be tested remain on the sockets. Therefore, it is preferable to check (determine) at these timing.

Also, when a maintenance checkup door provided to the electronic device testing apparatus is opened and closed, the possibilities are high that electronic devices used in the maintenance operation are forgotten to be taken out. Therefore, it is preferable to check (determine) at this timing.

Also, when a main power of the electronic device testing apparatus is turned on or when initialization of the electronic device testing apparatus is performed, memory of the previous control conditions is lost and, thereby, the possibilities are high that electronic devices to be tested remain on the sockets. Therefore, it is preferable to check (determine) at these timing.

Also, before conveying the first ones in new lot of electronic devices to be tested, preparation time is required. Therefore, to effectively utilize this time, it is preferable to check (determine) at this timing.

Also, when taking out all electronic devices to be tested held by the conveyer portions to trays in the unloader section, as same as the end of lot, there is spare time until the next electronic devices to be tested are conveyed to the sockets. Therefore, to effectively utilize this time, it is preferable to check (determine) at this timing.

Also, a teaching operation of the electronic device testing apparatus (a track teaching operation for setting a move amount of the contact arm to the sockets in the height direction by moving the contact arm up and down on the sockets when exchanging kinds of electronic devices to be tested and exchanging sockets) is performed manually by the operator, and the above disadvantages are caused if any of the electronic devices remain on the sockets in that case. Therefore, it is preferable to check (determine) at this timing.

It is also preferable to check (determine) at suitable timing in accordance with need by the operator, etc. by not particularly limiting the timing.

Furthermore, determination may be made at some timing by combining various timing explained above.

In the present invention, preferably, the mislay determination portion determines whether any of the electronic devices to be tested remain on the sockets by generating difference image data by performing difference processing on the reference image data and the check image data and performing threshold processing on the difference image data.

In the present invention, it is sufficient if only an existence of electronic devices to be tested is determined, therefore, whether any of the electronic devices to be tested remains can be effectively determined by performing difference processing and binarize processing.

In that case, preferably, the mislay determination portion performs pixel value correction on the reference image data according to the check image data before performing the difference processing. As a result, determination at high precision becomes possible on whether any of electronic devices to be tested remain on the sockets, and determination can be stabilized.

Also, in that case, preferably, the mislay determination portion performs brightness correction to substantially equalize brightness of the reference image data and that of the check image data, then, obtains brightness differences at corresponding pixel positions of the both and determines whether any of the electronic devices to be tested remain on the sockets based on an existence of an image portion wherein the thus obtained brightness difference exceeds a predetermined threshold. As a result, it is possible to effectively determine whether any of the electronic devices to be tested remain on the sockets.

In the present invention, when the mislay determination portion determines that an electronic device to be tested remain on the sockets, conveyance of an electronic device to be tested to a socket wherein the electronic device to be tested remains is suspended but the tests can be continued by conveying electronic devices to be tested to other sockets wherein no electronic device to be tested remains.

As a result, even if a part of the sockets has electronic devices to be tested remaining thereon, tests are not suspended and successively conducted only by sockets with no remaining electronic devices. Therefore, operation rates of the electronic device testing apparatus can be improved.

BRIEF DESCRIPTION OF DRAWINGS

These and other objects and features of the present invention will become clearer from the following description of the preferred embodiments given with reference to the attached drawings, in which.

DESCRIPTION OF NUMERALS OF DRAWINGS

Figure 1:
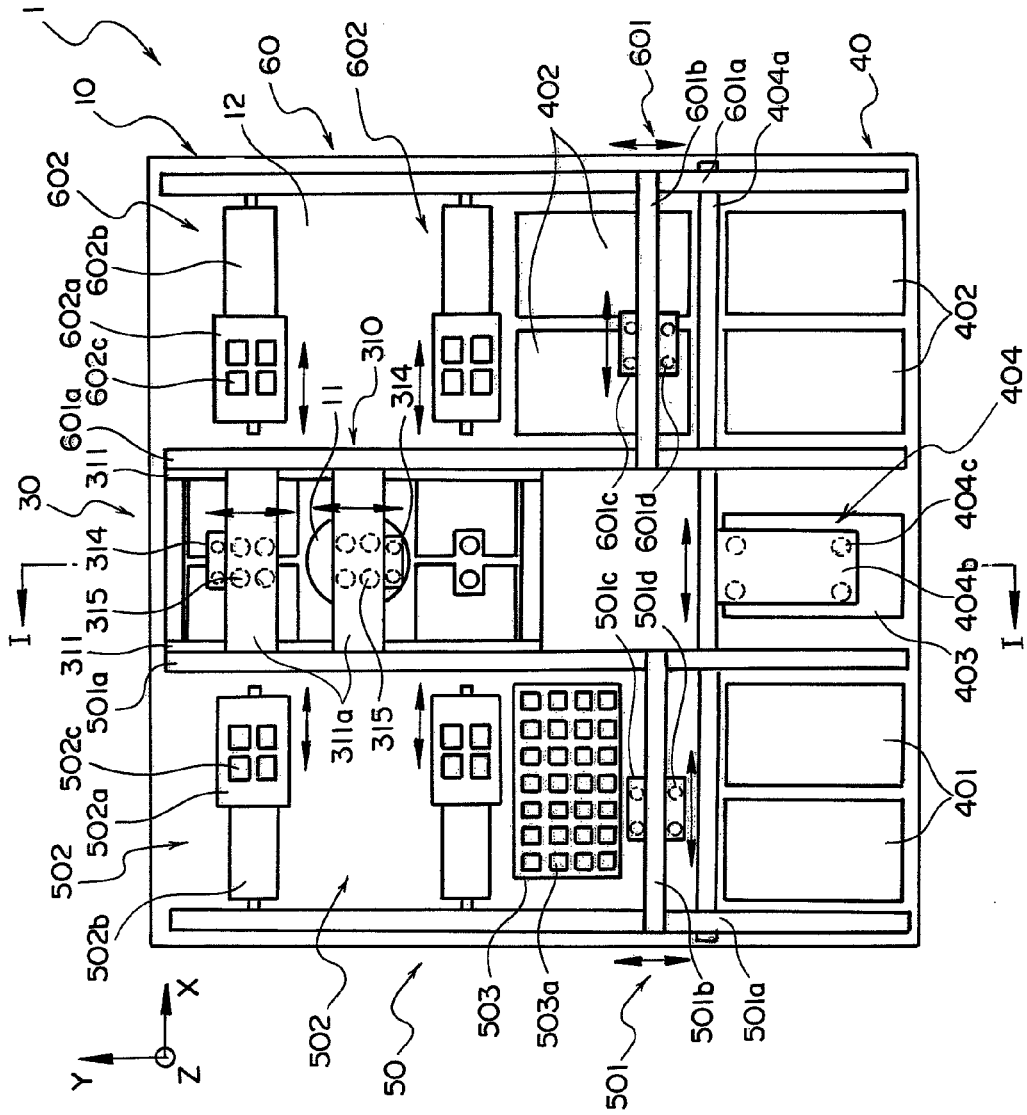
FIG. 1 is a plan view of an electronic device testing apparatus according to an embodiment of the present invention.

1: electronic device testing apparatus
10: electronic device testing apparatus (handler)
30: test section
301: contact portion
301*a*: socket
314: image pickup apparatuses
315: contact arm
318: mislay determination circuit
319: memory device
320: alarm device
50: loader section
60: unloader section

BEST MODE FOR CARRYING OUT THE INVENTION

Below, an embodiment of the present invention will be explained based on the drawings.

A form of an IC device (an electronic device to be tested) in the present embodiment is, as an example, a BGA or a CSP (chip size package), etc. provided with soldering balls as device terminals, but the present invention is not limited to those and it may be a QFP (quad flat package) or SOP (small outline package), etc. provided with lead pins as device terminals.

Figure 2:
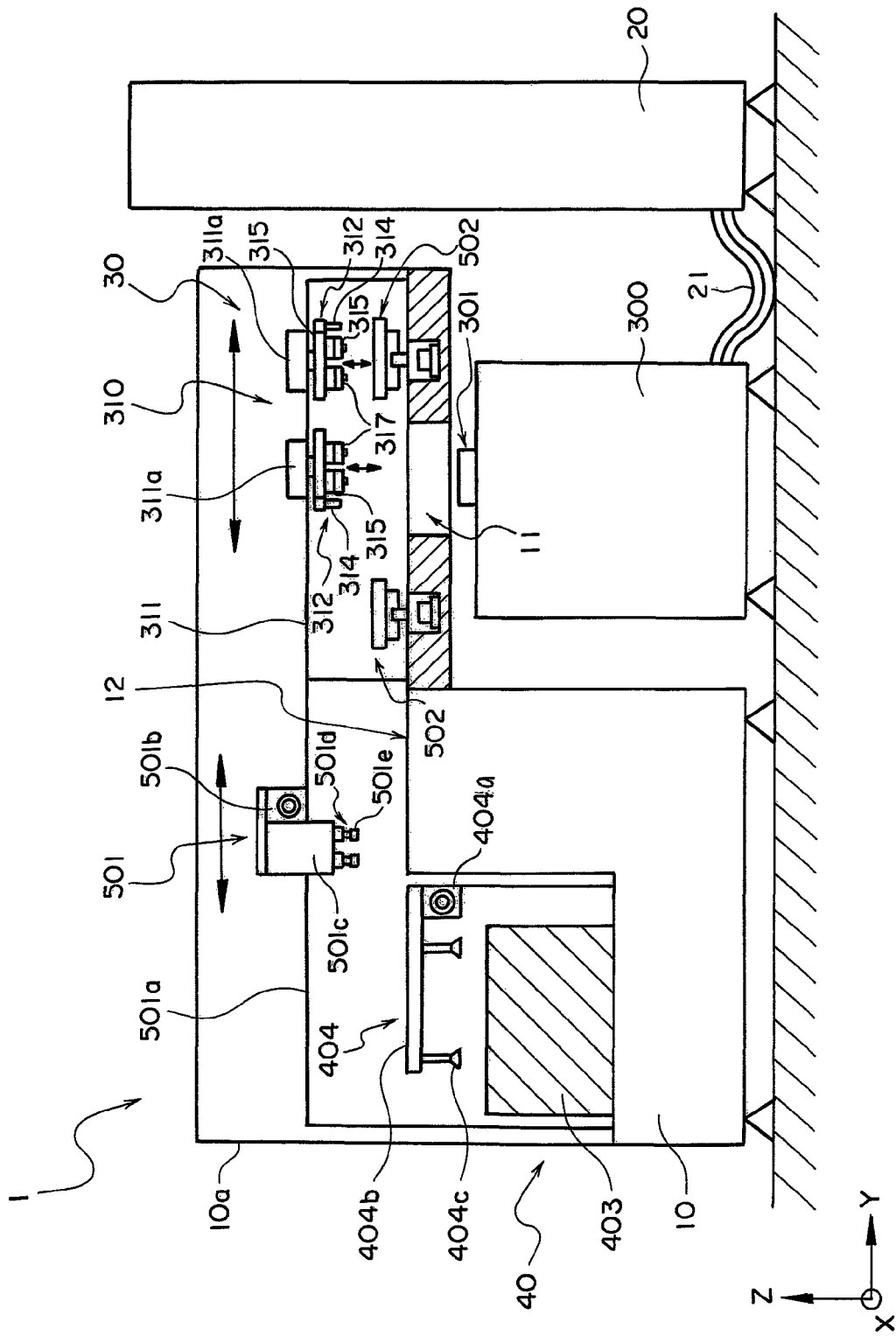
FIG. 2 is a partially sectional side view (a sectional view along the line I-I in FIG. 1) of the electronic device testing apparatus shown in FIG. 1.
Figure 3:
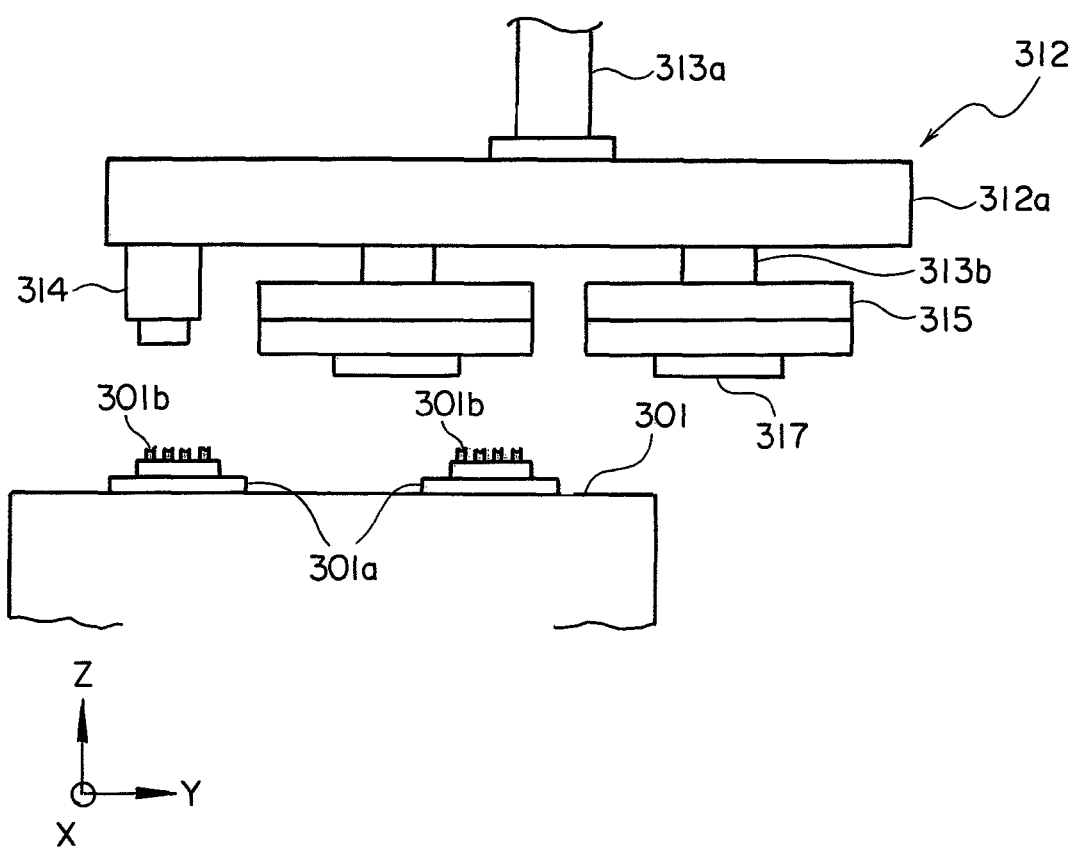
FIG. 3 is a side view of a movable head portion and an image pickup device used in the electronic device testing apparatus shown in FIG. 1.

As shown in FIG. 1 to FIG. 3, an electronic device testing apparatus 1 in the present embodiment comprises a handler 10, a test head 300 and a tester 20, wherein the test head 300 and the tester 20 are connected via a cable 21. Pre-test IC devices on a supply tray stored in a supply tray stocker 401 of the handler 10 are conveyed and pressed against sockets 301a of the contact portion 301 of the test head 300, a test of the IC devices is conducted via the test head 300 and the cable 21, then, the post-test IC devices are loaded on the classification trays stored in the classification tray stocker 402 in accordance with the test results.

The handler 10 mainly comprises a test section 30, an IC device magazine 40, a loader section 50 and an unloader section 60. Below, each component will be explained.

IC Device Magazine 40

The IC device magazine 40 is a part for storing pre-test and post-test IC devices and mainly comprises a supply tray stocker 401, a classification tray stocker 402, an empty tray stocker 403 and a tray conveyor device 404.

In the supply tray stocker 401, a plurality of supply trays loaded with a plurality of pre-test IC devices are stacked and, in the present embodiment, two supply tray stockers 401 are provided as shown in FIG. 1.

In the classification tray stocker 402, a plurality of classification trays loaded with a plurality of post-test IC devices are stacked and, in the present embodiment, four classification tray stockers 402 are provided as shown in FIG. 1. By providing four classification tray stockers 402, IC devices can be classified to four classes at maximum and stored in accordance with the test results.

The empty tray stocker 403 stores empty trays after supplying all pre-test IC devices loaded on the supply tray stocker 401 to the test section 30. Note that the number of the respective stockers 401 to 403 may be suitably set in accordance with need.

The tray conveyor device 404 is a conveyor device movable in the X-axis and Z-axis directions in FIG. 1 and mainly comprises an X-axis direction rail 404a, a movable head portion 404b and four suction pads 404c. An operation range thereof includes the supply tray stockers 401, a part of the classification tray stockers 402 (lower two classification tray stockers in FIG. 1) and the empty tray stockers 403.

In the tray conveyor device 404, the X-axis direction rail 404a fixed to a base 12 of the handler 10 supports from one side the movable head portion 404b to be movable in the X-axis direction. The movable head portion 404b is provided with a not shown Z-axis direction actuator and, at its tip portions, four suction pads 404c.

The tray conveyor 404 picks up and holds by the suction pads 404c an empty tray emptied at the supply tray stocker 401, transfers them to the empty tray stocker 401 by elevating them by the Z-axis direction actuator and moving the movable head portion 404b on the X-axis direction rail 404a. In the same way, when a classification tray becomes full with loaded post-test IC devices in the classification tray stocker 402, an empty tray is picked up by suction from the empty tray stocker 403 and held, elevated by the Z-axis direction actuator and, by moving the movable head portion 404b on the X-axis direction rail 404a, conveyed to the classification tray stocker 402.

Loader Section 50

The loader section 50 is a part for supplying pre-test IC devices from the supply tray stocker 401 of the IC device magazine 40 to the test section 30 and mainly comprises a loader section conveyor device 501 and two loader buffer portions 502 (two on the left in FIG. 1) and a heat plate 503.

The loader section conveyor device 501 is a device for moving IC devices on supply trays stacked in the supply tray stocker 401 of the IC device magazine 40 to on the heat plate 503 and moving IC devices on the heat plate 503 to on the loader buffer portion 502 and is composed mainly of a Y-axis direction rail 501a, an X-axis direction rail 501b, a movable head portion 501c and a suction portion 501d. The loader section conveyor device 501 operates in a range including the supply tray stocker 401, heat plate 503 and two loader buffer sections 502.

As shown in FIG. 1, the two Y-axis direction rails 501a of the loader section conveyor device 501 are fixed to the base 12 of the handler 10, and between them is the X-axis direction rail 502b supported to be movable in the Y-axis direction. The X-axis direction rail 502b supports the movable head portion 501c having a Z-axis direction actuator (not shown) to be movable in the X-axis direction.

The movable head portion 501c is provided with four suction portions 501d each having a suction pad 501e at its lower end portion and able to move the four suction portions 501d upward and downward separately in the Z-axis direction by driving the Z-axis direction actuator.

Each of the suction portions 501d is connected to a negative-pressure source (not shown) and capable of picking up and holding an IC device by generating a negative pressure by drawing air from the suction pad 501e and releasing the IC device by stopping drawing air from the suction pad 501e.

The heat plate 503 is a heat source for applying a predetermined thermal stress to IC devices to conduct a high temperature test and is, for example, a metal heat transfer plate having a heat source (not shown) at its lower part. On an upper surface of the heat plate 503, a plurality of recessed portions 503a for IC devices to be dropped therein are formed. Note that a cooling source may be provided instead of the heat source when conducting a low temperature test.

The loader buffer portion 502 is a device for moving IC devices back and forth between an operation range of the loader section conveyor device 501 and an operation range of the test section conveyor device 310 and mainly comprises a buffer stage 502a and an X-axis direction actuator 502b.

The buffer stage 502a is supported at one end portion of the X-axis direction actuator 502b fixed to the base 12 of the handler 10 and, as shown in FIG. 1, four recessed portions 502c each having a rectangular shape when seeing two dimensionally are formed for IC devices to be dropped therein on the upper surface of the buffer stage 502a.

Pre-test IC devices are conveyed from the supply tray stocker 401 to the heat plate 503 by the loader section conveyor device 501 and, after being heated to a predetermined temperature by the heat plate 503, conveyed to the loader buffer section 502 again by the loader section conveyor device 501, then, introduced to the test section 30 by the loader buffer section 502. Namely, time of being placed on the heat plate 503 is managed for the IC devices conveyed from the supply tray to the heat plate 503, and after a predetermined time, they are considered to be at a predetermined temperature and conveyed from the heat plate 503 to the loader buffer section 502. At this time, an operation of the loader section conveyor device 501 is to pick up four IC devices loaded on the supply tray, convey them to the heat plate 503, where four IC devices are left still for the predetermined time, pick up the heated IC devices and convey them to the loader buffer section 502.

Test Section 30

The test section 30 is a part for conducting a test by bringing external terminals (soldering balls) of IC devices to be tested electrically contact with contact pins 301b of a socket 301a of the contact portion 301. In the present embodiment, a check of an existence of remaining IC devices is made at predetermined timing. The test section 30 mainly comprises a test section conveyor device 310 and an image pickup apparatuses 314.

The test section conveyor device 310 is a device for moving IC devices among the loader buffer portions 502, the unloader buffer portion 602 and the test head 300.

In the test section conveyor device 310, two X-axis direction support members 311a being able to slide in the Y-axis direction are supported by two Y-axis direction rails 311 fixed to the base 12 of the handler 10. The movable head portion 312 is supported at the center part of each of the X-axis direction support member 311a, and an operation range of the movable head portion 312 includes the loader buffer portions 502, the unloader buffer portion 602 and the test head 300. Note that the movable head portions 312 supported respectively by the two X-axis direction support members 311a operating at the same time on a set of Y-axis direction rails 311 are controlled so as not to interfere with each other.

As shown in FIG. 3, each of the movable head portions 312 comprises a first Z-axis direction actuator 313a, whose upper end is fixed to the X-axis direction support member 311a, a support base body 312a fixed to a lower end of the first Z-axis direction actuator 313a, four second Z-axis direction actuators 313b, whose upper ends are fixed to the support base body 312a, and four contact arms 315 fixed to lower ends of the second Z-axis direction actuators 313b. The four contact arms 315 are provided to be corresponding to an arrangement of the sockets 301a, and the lower end portions of the contact arms 315 are provided with suction portions 317. Note that contact arms 315 used for a high temperature test or a low temperature test are provided with a heater or a cooler (not shown).

Each of the suction portions 317 is connected to a negative-pressure source (not shown) and capable of picking up and holding an IC device by generating a negative pressure by drawing air from the suction portion 317 and releasing the IC device by stopping drawing air from the suction portion 317.

According to the movable head portion 312 explained above, four IC devices held by the contact arm 315 can be moved in the Y-axis direction and Z-axis direction and pressed against the contact portion 301 of the test head 300.

As shown in FIG. 3, the image pickup device 314 is provided facing downward at one end of the support base body 312a of the movable head portion 312 and capable of taking an image of four sockets 301 a from above by moving the movable head portion 312. In the present embodiment, as shown in FIG. 1 and FIG. 2, the image pickup devices 314 are provided by the number of two to each of the movable head portions 312 and are four in total, however, they may be provided by the number of two to either one of the movable head portions 312.

As the image pickup apparatus 314, for example, a CCD camera may be used, but it is not limited to that and may be any as far as it is a device capable of taking a picture of an object by arranging a large number of image pickup devices, such as a MOS (metal oxide semiconductor) sensor array. The image pickup device 314 has a not shown lighting device and the sockets 301a as objects of a picture can be lighted brightly. Note that each of the image pickup devices 314 is connected to a not shown image processing device.

As shown in FIG. 3, the contact portion 301 of the test head 300 is provided with four sockets 301a in the present embodiment, and the four sockets 301a are arranged to substantially match with an arrangement of contact arms 315 of the movable head portion 312 of the test section conveyor device 310. Furthermore, each socket 301a is provided with a plurality of contact pins 301b arranged to substantially match with an arrangement of soldering balls of an IC device.

As shown in FIG. 2, in the test section 30, an opening portion 11 is formed on the base 12 of the handler 10 and the contact portion 301 of the test head 300 comes out through the opening portion 11 so as to be pressed by an IC device from above.

Four pre-test IC devices loaded on the loader buffer portion 502 are conveyed to the contact portion 301 of the test head 300 by the test section conveyor device 310, and the four are tested at the same time, then, conveyed to the unloader buffer portion 602 again by the test section conveyor device 310 and sent to the unloader section 60 by the unloader buffer portion 602.

Unloader Section 60

The unloader section 60 is a portion for taking out post-test IC devices from the test section 30 to the IC device magazine 40 and mainly comprises an unloader section conveyor device 601 and two unloader buffer portions 602 (two on the right in FIG. 1).

The unloader buffer portion 602 is a device for moving IC devices back and forth between an operation range of the test section conveyor device 310 and an operation range of the unloader section conveyor device 601 and mainly comprises a buffer stage 602a and an X-axis direction actuator 602b.

The buffer stage 602a is supported at one end portion of the X-axis direction actuator 602b fixed to the base 12 of the handler 10, and four recessed portions 602c for IC devices to be dropped therein are formed on an upper surface of the buffer stage 602a.

The unloader section conveyor device 601 is a device for moving and loading IC devices on the unloader buffer portion 602 to the classification trays of the classification tray stocker 402 and mainly comprises a Y-axis direction rail 601a, an X-axis direction rail 601b, a movable head portion 601c and suction portions 601d. An operation range of the unloader section conveyor device 601 includes two unloader buffers 602 and the classification tray stocker 402.

As shown in FIG. 1, two Y-axis direction rails 601a of the unloader section conveyor device 601 are fixed to the base 12 of the handler 10, and the X-axis direction rail 601b is supported between them and able to slide in the Y-axis direction. The X-axis direction rail 601b supports a movable head portion 601c provided with a Z-axis direction actuator (not shown) to be able to move in the X-axis direction.

The movable head portion 601c is provided with four suction portions 601d, each having a suction pad at its lower end portion, and the four suction portions 601d can be moved up and down in the Z-axis direction separately by driving the Z-axis direction actuator explained above.

Post-test IC devices loaded on the unloader buffer portions 602 are taken out from the test section 30 to the unloader section 60 and loaded on the classification trays of the classification tray stocker 402 from the unloader buffer portions 602 by the unloader section conveyor device 601.

In addition to the above, the handler 10 according to the present embodiment comprises a control portion for controlling various operations of the handler 10 and counting test times, an image processing device for processing image data obtained from the image pickup device 314, a memory device for storing reference image data of sockets 301a and an alarm device, such as a speaker, buzzer and alarm light, etc.

Next, a flow of conveying and testing operations of the handler 10 will be explained.

First, the loader section conveyor device 501 uses the suction pads 501e of the four suction portions 501d to pick up and hold four IC devices on the supply tray positioning at the uppermost level of the supply tray stocker 401 of the IC device magazine 40.

The loader section conveyor device 501 elevates four IC devices by the Z-axis direction actuator of the movable head portion 501c while holding the four IC devices, moves the X-axis direction rail 501b on the Y-axis direction rails 501a and moves the movable head portion 501c on the X-axis direction rail 501b so as to move the IC devices to the loader section 50.

Then, the loader section conveyor device 501 performs alignment above the recessed portions 503a on the heat plate 503, lowers the movable head portion 501c by the Z-axis direction actuator, and releases the suction pads 501e to drop IC devices into the recessed portions 503a on the heat plate 503. When the IC devices are heated to a predetermined temperature by the heat plate 503, the loader section conveyor device 501 again holds the heated four IC devices and moves to above one of the loader buffer portions 502 in a standby state.

The loader section conveyor 501 performs alignment above the buffer stage 502a of the standby loader buffer portions 502, lowers the movable head portion 501c by the Z-axis direction actuator, and releases IC devices picked up and held by the suction pads 501e of the suction portion 501d to place them in the recessed portions 503c on the buffer stage 502a.

While carrying the four IC devices on the recessed portions 502c of the buffer stage 502a, the loader buffer portion 502 moves the four IC devices from an operation range of the loader section conveyor device 501 of the loader section 50 to an operation range of the test section conveyor device 310 of the test section 30 by the X-axis direction actuator 502b.

When the buffer stage 502a loaded with IC devices moves into the operation range of the test section conveying device 310 as explained above, the movable head portion 312 of the test section conveyor device 310 moves to above the IC devices placed in the recessed portions 502c on the buffer stage 502a. Then, the movable head portion 312 is lowered by the first Z-axis direction actuator 313a, and the suction portions 317 of the four contact arms 315 of the movable head portion 312 pick up and hold the four IC devices placed in the recessed portions 502c on the buffer stage 502a of the loader buffer portion 502.

The movable head portion 312 holding the four IC devices elevates by the first Z-axis direction actuator 313a of the movable head portion 312.

Next, the test section conveyor device 310 moves the X-axis direction support member 311 a supporting the movable head portion 312 on the Y-axis direction rails 311 to convey the four IC devices held by the suction portions 317 of the contact arms 315 of the movable head portion 312 to above four sockets 301a of the contact portion 301 of the test head 300.

The movable head portion 312 extends the first Z-axis direction actuator 313a and the second Z-axis direction actuator 313b holding the IC devices to bring the soldering balls 2a of each IC device contact with the contact pins 301b of each socket 301a. During the contact, electric signals are sent and received via the contact pins, so that a test is conducted on the IC devices.

When the test of the IC devices is completed, the test section conveyor device 310 elevates the post-test IC devices as a result of shrinkage of the first Z-axis direction actuator 313a and the second Z-axis direction actuator 313b of the movable head portion 312, slides the X-axis direction support member 311a supporting the movable head portion 312 on the Y-axis direction rail 311 and conveys the four IC devices held by the contact arm 315 of the movable head portion 312 to above the buffer stage 602a of one of the unloader buffer portions 602 in a standby state in the operation range of the test section conveyor device 310.

The movable head portion 312 extends the first Z-axis direction actuator 313a and releases the suction pads 317c to drop the four IC devices to the recessed portions 602c on the buffer stage 602a.

The unloader buffer portion 602 drives the X-axis direction actuator 602b while carrying the post-test four IC devices and moves the IC devices from the operation range of the test section conveyor device 310 of the test section 30 to the operation range of the unloader section conveyor device 601 of the unloader section 60.

Next, the Z-axis direction actuator of the movable head portion 601c of the unloader section conveyor device 601 positioning above the unloader buffer portion 602 is extended, and the four suction portions 601d of the movable head portion 601c pick up and hold post-test four IC devices placed in the recessed portions 602c of the buffer stage 602a of the unloader buffer portion 602.

While carrying the post-test four IC devices, the unloader section conveyor device 601 elevates the four IC devices by the Z-axis direction actuator of the movable head potion 601c, moves the X-axis direction rail 601b on the Y-axis direction rails 601a and moves the movable head portion 601c on the X-axis direction rail 601b to move the IC devices to above the classification tray stocker 402 of the IC device magazine 40. Then, the respective IC devices are loaded on classification trays at the uppermost level of the classification tray stockers 402 in accordance with the test results of the IC devices.

As explained above, a test of IC devices is conducted once.

Next, a check of an existence of remaining IC devices in the handler 10 will be explained.

The check of an existence of remaining IC devices in the present embodiment is a step of checking whether any of previous IC devices remain on the sockets 301a when conveying IC devices to the sockets 301a. To make the check, before conducting the test of IC devices as explained above, reference image data of the sockets 301a in a state where no IC device remains is obtained in advance by using the image pickup devices 314 and stored in the memory device 319.

Specifically, when setting a test head 30 having the sockets 301a at its contact portion 301 to the handler 10, the image pickup devices 314 are conveyed above the sockets 301a to take an image of respective sockets 301a and the image is stored as reference image data in the memory device 319.

Figure 5:
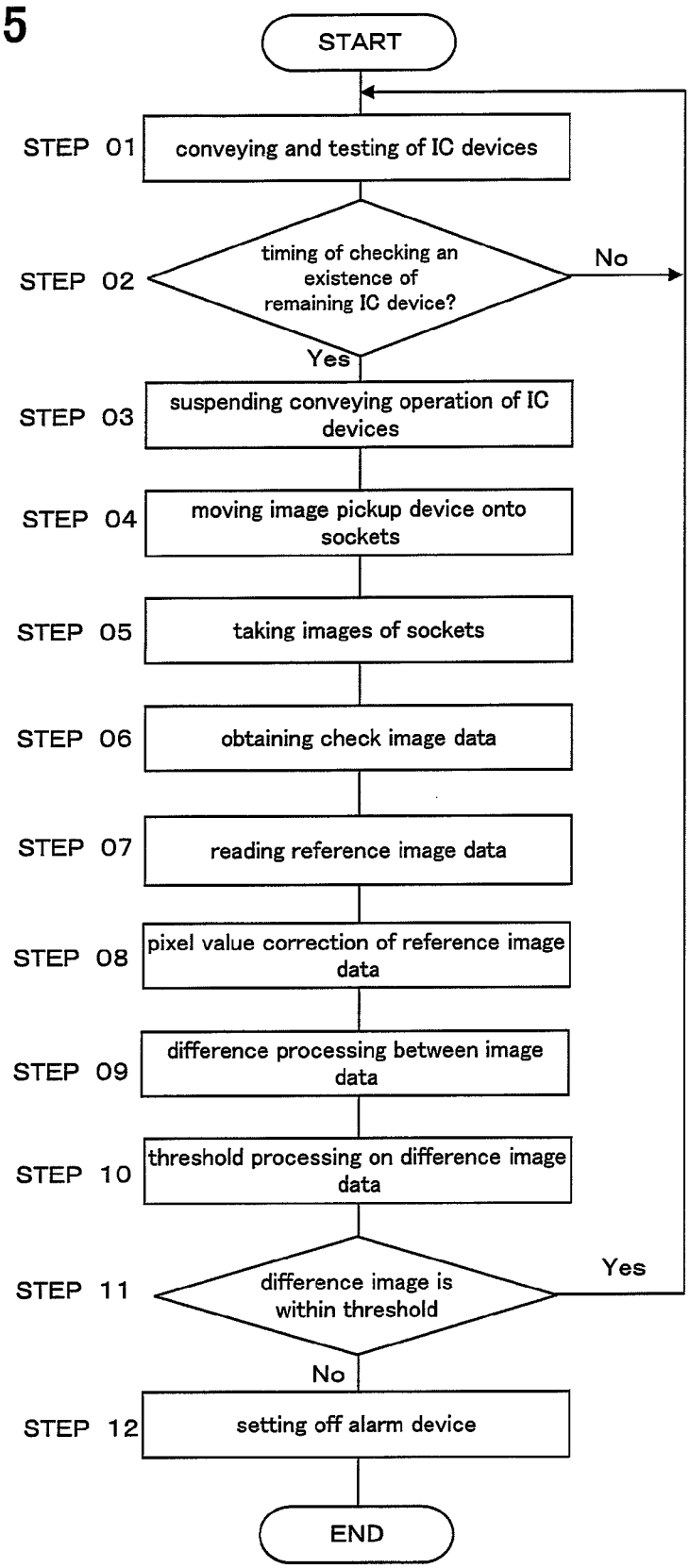
FIG. 5 is a flowchart showing a procedure of checking sockets in the electronic device testing apparatus shown in FIG. 1.

Below, a procedure of the check of an existence of remaining IC device will be explained with reference to the flowchart shown in FIG. 5.

The handler 10 repeats conveyance and tests of IC devices as explained above (STEP01). However, when timing of the check of an existence of remaining IC device comes (STEP02), an conveying operation of IC devices stops (STEP03), the X-axis direction support member 311a supporting the movable head portion 312 is moved on the Y-axis direction rails 311 and the image pickup devices 314 are moved to above the sockets 301a (STEP04; refer to FIG. 3).

In the present invention, timing of checking whether any of IC devices remain on the sockets 301a is not particularly limited and may be, for example, when abnormality arises in the operation of pressing IC devices against the sockets 301*a*, when abnormality arises in the operation of picking up by suction IC devices on the sockets 301*a*, when a maintenance checkup door (not shown) provided to a chasses 10*a* (refer to FIG. 2) of the handler 10 is opened and closed, when a main power of the handler 10 is turned on, when initialization of the handler 10 is performed, when lot of IC devices to be tested changes, when taking out all IC devices held by the conveyer devices 404, 501, 310 and 601 of the handler 10, when performing a teaching operation of the handler 10, etc. Also, it is preferable that a manual instruction is also provided so that the check can be made at any time by an operator's operation.

Returning back to FIG. 5, the handler 10 takes images of the sockets 301*a* by the image pickup devices 314 (STEP05) to obtain check image data (STEP06). At this time, the lighting devices of the image pickup devices 314 light the sockets 301 a brightly. The image pickup devices 314 respectively take images of two sockets 301 a next to each other in the Y-axis direction (two sockets 301*a* on the right and left in FIG. 3) by moving the movable head portion 312 in the Y-axis direction.

Figure 4:
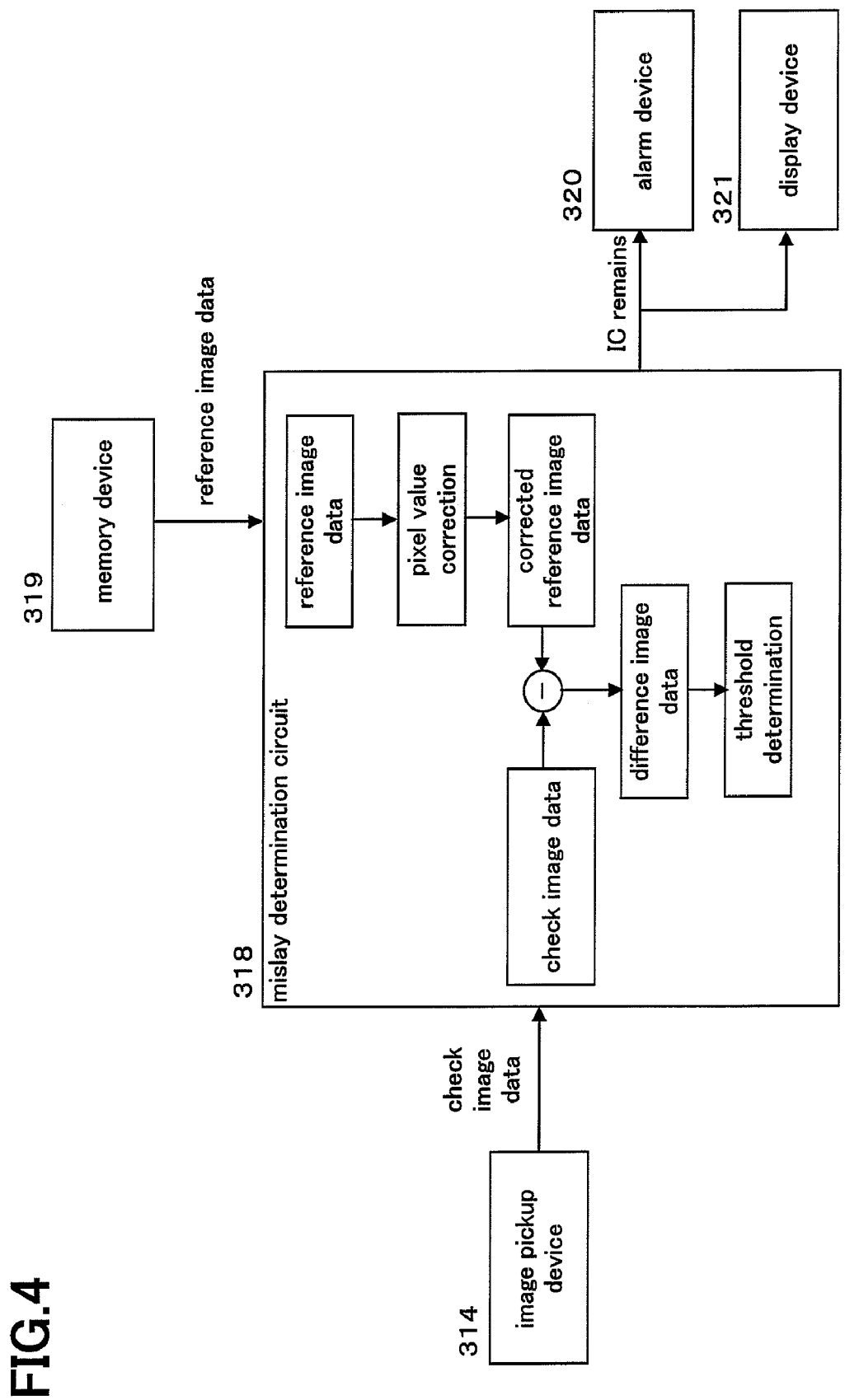
FIG. 4 is a block diagram showing a relationship of the image pickup portion, a mislay determination portion and a memory portion according to the present invention.

The mislay determination circuit 318 of the handler 10 shown in FIG. 4 reads the reference image data from the memory device 319 (STEP07), corrects pixel values (intensity, brightness) of the reference image data according to the check image data obtained as explained above (STEP08). By performing the pixel value correction processing as such, IC devices remaining on the sockets can be detected at high accuracy, and the check of an existence of remaining IC device can be stabilized. Note that, if desired, pixel values of the reference image data may be left unchanged and pixel values of the obtained check image data may be corrected according to the reference image data.

The mislay determination circuit 318 of the handler 10 performs difference processing between the reference image data subjected to the pixel value correction processing and the check image data to generate a difference image (STEP09) and performs threshold processing on the difference image (STEP10). Then, the mislay determination circuit 318 determines that no IC device remains on the sockets when the difference image is within a predetermined threshold, while determines that an IC device remains on the sockets 310*a* when exceeding the threshold (STEP11).

When the mislay determination circuit 318 of the handler 10 determines that no IC device remains on the sockets 301*a* (Yes in STEP11), the procedure returns back to the STEP01 to repeat conveyance and tests of IC devices again.

On the other hand, when the mislay determination circuit 318 of the handler 10 determines that an IC device remains on the sockets 301*a* (No in STEP11), the handler 10 sets off the alarm device 320 (STEP12) to promote awareness. At this time, conveyance and tests of IC devices are suspended.

At this time, the display device 321 may display positional information telling which socket portion has an IC device remaining thereon among the four sockets 301*a*, or the display device 321 may display a view of the conveying paths in the electronic device testing apparatus or a view of a specific part of the conveying paths and also (by overlaid display) at which part of the conveying paths an IC device remains. Alternately, the display device 321 may display the check image data and/or the difference image data at the same time, or a cursor (or a "marker") indicating a position of an IC device may be overlaid on the image so as to move the image pickup devices 314 and zoom the displayed image. By displaying as above, it is unnecessary to find out which socket has a remaining IC device or whether the IC device remains on the sockets or out of the sockets when removing the remaining IC device; and it is possible to monitor an image after the IC device is removed. Therefore, workability of the operator improves. Here, a level of the above threshold for automatic determination may be registered by adjusting the same to attain the optimal threshold condition as needed while displaying the difference image data on the display device 321 by the operator. Although differences exist in the obtained difference image data depending on kinds, shapes and colors of IC devices, correct automatic determination is attained by adjusting the threshold.

Alternately, it may be configured to be able to manually operate the movable heads 312 while displaying to monitor the remaining condition of IC devices on the display device 321. This allows the operator to manually control movements of the movable heads 312 to pick up the remaining IC device, load the same on the buffer stage 602*a* and take it out to the unloader section 60 when it is possible to pick up the remaining IC device by the movable heads 312, so that it can be handled in a short time. This also releases the operator from operations of directly touching the test section 30 applied to a high/low temperature test. Furthermore, a long recovery time for recovering the test section 30 from the normal temperature to a high/low temperature becomes unnecessary after temporarily returning the test section 30 to be at the normal temperature for taking out the remaining IC device. Note that, in the case where it is possible to automatically pick up a remaining IC device and take it out to the unloader section based on the check image data and/or difference image data, it may be configured to automatically control the movable heads 312 to take it out.

Activation of the alarm device 320 makes the operator aware that an IC device remains on the sockets 301*a*, consequently, the IC device can be removed from the sockets 301*a*. Also, in that case, since conveyance and tests of IC devices are automatically suspended, it is possible to prevent a so-called "double placing disadvantage" that a next IC device is pressed on a remaining IC device in successive tests of the rest of IC devices.

As explained above, according to the handler 10 of the present embodiment, it is possible to automatically detect whether any of IC devices remain on the sockets 301*a* at suitable timing, therefore, damages on the sockets 301*a* or IC devices due to the "double placing disadvantage" can be prevented in advance. Also, disadvantages that good devices are erroneously distinguished as defective devices and good devices are destroyed due to the "double placing disadvantage" can be eliminated adequately, therefore, test quality of the electronic device testing apparatus 1 can be improved.

The embodiments explained above are for easier understanding of the present invention and not to limit the present invention. Accordingly, respective elements disclosed in the above embodiments include all modifications in designs and equivalents belonging to the technical field of the present invention.

For example, in the handler 10 according to the above embodiment, four image pickup devices 314 were provided as an example, however, as another configuration example, the image pickup devices 314 may be provided to only one of the two movable head portions 312. Alternately, being separate from the movable head portions 312, it may be configured to provide one image pickup device 314 to an independent move mechanism and take images of respective sockets 301*a* by moving the image pickup device 314 in the X-axis and Y-axis directions.

Also, in the above embodiment, as an example, conveyance and tests of IC devices were suspended after activating the alarm device in the STEP12, however, tests may be conducted continuously by using only good sockets. For example, pickup by suction and conveyance may be controlled not to place any IC devices in a recessed portion 502c of the loader buffer portion 502 corresponding to a socket position where a remaining IC device is detected and to place IC devices in recessed portions 502c corresponding to socket positions where no IC device remains. In this case also, it is preferable to notify by an alarm that an IC device remains. As a result, tests can be continuously conducted only by available sockets, so that the operation rates of the electronic device testing apparatus 1 can be improved.

Also, an electronic device testing apparatus of the present invention may be configured to provide the image pickup devices to desired portions of conveying paths, where an IC device possibly remains, outside of the above explained test section 30.

The invention claimed is:

1. An electronic device testing apparatus for conducting a test of electric characteristics of an electronic device to be tested, comprising:
   a socket provided at a test section of the electronic device testing apparatus;
   a movable head member movably provided along an X-axis rail and a Y-axis rail;
   a first actuator moving the movable head member along the X-axis rail and the Y-axis rail;
   a contact arm member provided on the movable head member, holding and releasing the electronic device on an end portion thereof;
   a second actuator moving the movable head member or the contact arm member along a Z-axis direction;
   a controller controlling the first actuator and the second actuator for moving the electronic device to be tested to the socket, bringing the electronic device to be tested in electrical contact with the socket to conduct the test of electric characteristics of the electronic device to be tested, and then removing the electronic device from the socket;
   an image pickup device provided on the movable head member that takes an image of the socket;
   a memory device that stores reference image data of the socket in a state of being not placed with the electronic device to be tested obtained by taking images by the image pickup device; and
   a determination controller that obtains check image data of the socket by the image pickup device before moving the electronic device to be tested to the socket, reads the reference image data from the memory device, compares the check image data with the reference image data and determines whether the electronic device to be tested has been removed from the socket; and
   an alarm device that promotes awareness of an unremoved electronic device when the determination controller determines that the electronic device to be tested has not been removed from the socket.

2. The electronic device testing apparatus as set forth in claim 1, wherein:
   when abnormality arises in an operation of pressing the electronic device to be tested against the socket or when abnormality arises in a suction operation of the electronic device to be tested on the socket,
   the determination controller takes images of the socket by the image pickup device and determines whether the electronic device to be tested has been removed before moving a next electronic device to be tested to the socket.

3. The electronic device testing apparatus as set forth in claim 1, wherein:
   when a maintenance checkup door provided to the electronic device testing apparatus is opened and closed,
   the determination controller takes images of the socket by the image pickup device and determines whether the electronic device to be tested has been removed before moving a next electronic device to be tested to the socket.

4. The electronic device testing apparatus as set forth in claim 1, wherein:
   when a main power of the electronic device testing apparatus is turned on or when initialization is performed on the electronic device testing apparatus,
   the determination controller takes images of the socket by the image pickup device and determines whether the electronic device to be tested has been removed before moving a next electronic device to be tested to the socket.

5. The electronic device testing apparatus as set forth in claim 1, wherein
   the determination controller takes images of the socket by the image pickup device and determines whether the electronic device to be tested has been removed before moving a next electronic device to be tested in a new lot to the socket.

6. The electronic device testing apparatus as set forth in claim 1, wherein
   the determination controller takes images of the socket by the image pickup device and determines whether the electronic device to be tested has been removed after taking out all of electronic devices to be tested held on the contact arm member to a tray of an unloader section and before moving a next electronic device to be tested to the socket.

7. The electronic device testing apparatus as set forth in claim 1, wherein
   the determination controller takes images of the socket by the image pickup device and determines whether the electronic device to be tested has been removed from the socket before performing a teaching operation on the electronic device testing apparatus.

8. The electronic device testing apparatus as set forth in claim 1, wherein:
   when an instruction is input from the outside,
   the determination controller takes images of the socket by the image pickup device and determines whether the electronic device to be tested has been removed from the socket.

9. The electronic device testing apparatus as set forth in claim 1, wherein the determination controller determines whether the electronic device to be tested has been removed from the socket by generating difference image data by performing difference processing on the reference image data and the check image data and performing threshold processing on the difference image data.

10. The electronic device testing apparatus as set forth in claim 9, wherein the determination controller performs pixel value correction on the reference image data according to the check image data before performing the difference processing.

11. The electronic device testing apparatus as set forth in claim 9, wherein the determination controller performs brightness correction to substantially equalize brightness of the reference image data and that of the check image data, then, obtains brightness differences at corresponding pixel positions of the both and determines whether the electronic device to be tested has been removed from the socket based on an existence of an image portion wherein the thus obtained brightness difference exceeds a predetermined threshold.

12. The electronic device testing apparatus as set forth in claim 1, wherein
when the determination controller determines that the electronic device to be tested has not been removed from the socket, conveyance of an electronic device to be tested to a socket wherein the electronic device to be tested has not been removed from the socket is suspended but electronic devices to be tested are conveyed to other sockets in which the electronic devices to be tested have been removed from the sockets so as to continue tests.

13. The electronic device testing apparatus as set forth in claim 1, comprising a display device that displays positional information of an unremoved electronic device to be tested.

14. The electronic device testing apparatus as set forth in claim 1, comprising a display device that displays conveying paths of electronic devices to be tested, and an unremoved electronic device to be tested is displayed by overlaid display on the display device.

15. The electronic device testing apparatus as set forth in claim 1, comprising a display device that displays the check image data obtained by taking images by the image pickup device and/or difference image data obtained based on difference processing performed on the reference image data and the check image data.

16. The electronic device testing apparatus as set forth in claim 1, comprising
a suction conveyor portion that picks up by suction an unremoved electronic device to be tested and conveys the same, capable of being operated manually by an operator to pick up by suction and convey;
wherein an image of the unremoved electronic device to be tested is taken by one of the image pickup devices and displayed on the display device; and
based on the suction conveyor portion, the unremoved electronic device to be tested is taken out to the outside.

17. The electronic device testing apparatus as set forth in claim 16, wherein the conveyor portion is controlled to take out an unremoved electronic device to be tested to the outside based on the check image data obtained by taking an image of the unremoved electronic device to be tested by one of the image pickup device or difference image data obtained based on the check image data and the reference image data.

* * * * *